United States Patent [19]

Whatley

[11] 4,342,926

[45] Aug. 3, 1982

[54] BIAS CURRENT REFERENCE CIRCUIT

[75] Inventor: Roger A. Whatley, Austin, Tex.

[73] Assignee: Motorola, Inc., Schaumburg, Ill.

[21] Appl. No.: 207,532

[22] Filed: Nov. 17, 1980

[51] Int. Cl.[3] .......................... G05F 3/16; H03L 1/00; H03L 5/00

[52] U.S. Cl. .................................... 307/297; 307/304; 323/315

[58] Field of Search ................ 307/297, 304; 323/312, 323/313, 315–317

[56] References Cited

U.S. PATENT DOCUMENTS

| | | | |
|---|---|---|---|
| 3,806,742 | 4/1974 | Powell | 307/304 |
| 3,823,332 | 7/1974 | Feryszka et al. | 307/297 |
| 4,032,839 | 6/1977 | Ahmed | 307/297 X |
| 4,096,430 | 6/1978 | Waldron | 307/297 X |
| 4,135,125 | 1/1979 | Oura | 307/297 X |
| 4,281,261 | 7/1981 | Adam | 307/297 X |
| 4,300,091 | 11/1981 | Schade, Jr. | 307/297 X |
| 4,302,718 | 11/1981 | Schade, Jr. | 323/315 X |

OTHER PUBLICATIONS

Gray et al., *Analysis and Design of Analog Integrated Circuits*; pp. 239–261; John Wiley & Sons, 1977.

*Primary Examiner*—Larry N. Anagnos
*Attorney, Agent, or Firm*—Anthony J. Sarli, Jr.; Jeffrey Van Myers; Robert L. King

[57] ABSTRACT

A bias current reference circuit is disclosed having a diode-connected bipolar device connected in series with an MOS device to develop a reference voltage which is proportional to a bias current. The reference voltage is used by an MOS device connected in series with a resistor to develop a reference current which is proportional to the reference voltage. The reference current is used by a diode-connected MOS device to develop a bias voltage which is proportional to the reference current. The bias voltage in turn is used by another MOS device to develop the bias current in proportion to the bias voltage. The bias voltage is also used by other MOS devices to provide similar bias currents. In the disclosed embodiment, such a bias current is used by a complementary diode-connected MOS device to develop a complementary bias voltage. The complementary bias voltage may be used to develop start-up bias current in the event the bias current reference circuit fails to provide a suitable bias voltage.

13 Claims, 1 Drawing Figure

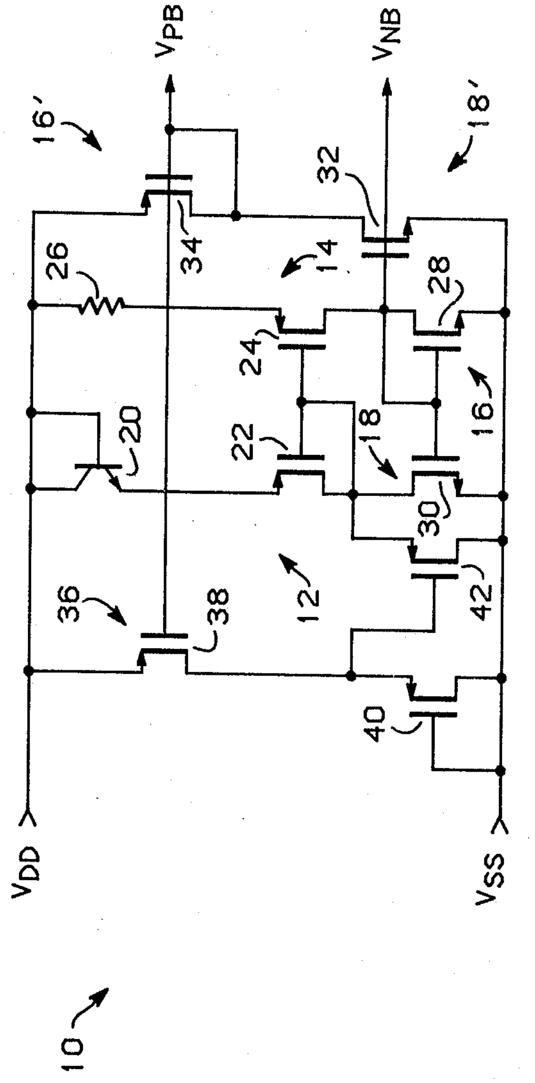
VPB
VNB
16'
18'
32
34
26
14
28
24
22
20
18
16
30
36
38
12
42
40
VDD
VSS
10

BIAS CURRENT REFERENCE CIRCUIT

TECHNICAL FIELD

This invention relates generally to reference circuits and, more particularly, to a circuit which provides reference voltages for bias current generators and the like.

BACKGROUND ART

In general, bias reference circuits can be classified by the source of the voltage standard by which the bias currents are established. As noted in *Analysis and Design of Analog Integrated Circuits* by Paul R. Grey and Robert G. Meyer (John Wiley & Sons, 1977, pages 239–261), the most convenient standards are the $V_{BE}$ of a transistor, the thermal voltage, $V_T$, and the breakdown voltage of a reverse-biased emitter-base junction of a transistor. While each of these voltage reference elements may be readily fabricated using conventional bipolar integrated circuit fabrication processes, it is significantly more difficult to fabricate the open-collector bipolar devices utilized in common $V_{BE}$ reference circuits using conventional MOS integrated circuit fabrication processes. On the other hand, the reverse-biased emitter-base junction or Zener diode reference circuit, although manufacturable in most MOS fabrication processes, generally requires supply voltages exceeding 7 to 8 volts, and tends to introduce significant amounts of noise under reverse-breakdown conditions.

BRIEF SUMMARY OF INVENTION

It is an object of the present invention to provide an MOS bias current reference circuit which generates a bias voltage which is substantially supply voltage independent, using the $V_{BE}$ of a bipolar transistor.

Another object of the present invention is to provide a self-biasing MOS bias current reference circuit capable of generating complementary bias voltages even when used with relatively low supply voltages.

These and other objects of the invention are achieved in accordance with a preferred embodiment of the invention by providing a voltage reference device which establishes a reference voltage in response to a control current directed therethrough. A voltage mirror coupled to the voltage reference device reflects the reference voltage as a control voltage coupled to a current reference device. The current reference device provides a reference current proportional to the control voltage. A current mirror coupled to the current reference device directs a control current proportional to the reference current through the voltage reference device. In a preferred form, means are provided to direct a start-up current through the voltage reference device in response to the control voltage being below a predetermined threshold.

BRIEF DESCRIPTION OF THE DRAWING

The FIGURE illustrates in schematic form a bias current reference circuit constructed in accordance with the preferred embodiment of the present invention.

DESCRIPTION OF THE PREFERRED EMBODIMENT

Shown in the drawing is a bias current reference circuit 10 constructed in accordance with the preferred embodiment of the present invention. The reference circuit 10 is comprised generally of a reference voltage portion 12, a reference current portion 14, a bias voltage portion 16 and a bias current portion 18. In the reference voltage portion 12, an NPN bipolar transistor 20 has the base and collector thereof connected to a positive supply $V_{DD}$, and the emitter thereof connected to the source of a P-channel MOS transistor 22 which has the gate and drain thereof connected to the reference current portion 14 and to the bias current portion 18. In this configuration, a reference voltage with respect to the positive supply $V_{DD}$ will be developed on the gate of the transistor 22 which is the sum of the $V_{BE}$ of the diode-connected transistor 20 and the $V_{GS}$ of the diode-connected transistor 22, the latter being proportional to a bias current directed therethrough by the bias current portion 18.

In the reference current portion 14, a P-channel MOS transistor 24 has the source thereof connected to the positive supply $V_{DD}$ via a resistor 26, the gate thereof connected to the gate and drain of the transistor 22, and the drain thereof connected to the bias voltage portion 16. By constructing the transistor 24 to have the same ratio of channel width to channel length as the transistor 22 and thus the same current density, the gate to source voltage $V_{GS}$ of the transistor 24 will be substantially the same as that of the transistor 22. Thus, the base-emitter voltage $V_{BE}$ of the transistor 20 will be reflected across the resistor 26. The reference current portion 14 will therefore provide a reference current which is proportional to the reference voltage provided by the reference voltage portion 12.

In the bias voltage portion 16, an N-channel MOS transistor 28 has the source thereof connected to a negative supply $V_{SS}$, and the gate and drain thereof connected to the drain of the transistor 24 of the reference current portion 14. In this configuration, the diode-connected transistor 28 will develop a gate to source voltage $V_{GS}$ which is proportional to the reference current. This voltage, indicated as $V_{NB}$, is suitable for biasing other N-channel MOS transistors used as constant bias current sinks.

In the bias current portion 18, an N-channel MOS transistor 30 has the source thereof connected to the negative supply $V_{SS}$, the gate thereof connected to the gate and drain of the transistor 28, and the drain thereof connected to the gate and drain of the transistor 22. In this configuration, the transistor 30 will allow a bias current proportional to the bias voltage $V_{NB}$ to flow through the transistors 20 and 22 of the reference voltage portion 12.

In operation, a shift in the voltage at the emitter of the transistor 20 caused by a shift in the positive supply $V_{DD}$ relative to the negative supply $V_{SS}$ will be reflected by the transistors 22 and 24 as a corresponding shift in the voltage across the resistor 26. With a constant applied voltage, the current provided by the resistor 26 will remain constant even in the presence of significant shifts in the positive supply $V_{DD}$. So long as the current provided by the resistor 26 remains constant, the bias voltage $V_{NB}$ developed by the transistor 28 tends to remain constant relative to the negative supply $V_{SS}$, even in the presence of significant shifts in the voltage thereof. Thus, the bias voltage $V_{NB}$, although referenced to the $V_{BE}$ of the transistor 20, remains substantially independent of shifts in the supply voltages $V_{DD}$ and $V_{SS}$.

In some applications, it may be desirable to provide a P-channel bias voltage $V_{PB}$, as a counterpart for the N-channel bias voltage $V_{NB}$. In the illustrated embodiment, this is accomplished using a second bias current portion 18' and a second bias voltage portion 16'. In the second bias current portion 18', an N-channel MOS transistor 32 has the source thereof connected to the negative supply $V_{SS}$, the gate thereof connected to the gate and drain of the transistor 28 of the bias voltage portion 16, and the drain thereof connected to the second bias voltage portion 16'. In the second bias voltage portion 16', a P-channel MOS transistor 34 has the gate and drain thereof connected to the drain of the transistor 32, and the source thereof connected to the positive supply $V_{DD}$. In this configuration, the transistor 32 will allow a bias current proportional to the N-channel bias voltage $V_{NB}$ to flow through the transistor 34. In response to the bias current, the diode-connected transistor 34 develops a gate to source voltage $V_{GS}$ which is proportional to the bias current, but referenced to the positive supply $V_{DD}$ rather than the negative supply $V_{SS}$. This voltage, indicated as $V_{PB}$, is suitable for biasing other P-channel MOS transistors used as constant current sources.

Upon initial application of power, the bias current reference circuit 10 may assume either an inactive or an active state. For example, if no current flows through the reference voltage portion 12 during power up, no reference voltage will be developed for application to the reference current portion 14. Thus, no reference current will be provided by the reference current portion 14. Without reference current, the bias voltage portion 16 will be unable to establish the bias voltage $V_{NB}$ and enable the bias current portion 18 to direct bias current through the reference voltage portion 12. The bias current reference circuit 10 will therefore remain in the inactive state.

In the illustrated embodiment, however, a start-up portion 36 is provided to allow start-up current to flow through the reference voltage portion 12 when the P-channel bias voltage $V_{PB}$ with respect to the positive supply $V_{DD}$ is less than a predetermined threshold. In the start-up portion 36, a P-channel MOS transistor 38 has the source thereof connected to the positive supply $V_{DD}$ and the gate thereof connected to the gate and drain of the transistor 34 of the second bias voltage portion 16'. The drain of the transistor 38 is connected to the source of a P-channel MOS transistor 40 which has the gate and drain thereof connected to the negative supply $V_{SS}$. The drain of the transistor 38 is also connected to the gate of a P-channel MOS transistor 42 which has the source thereof connected to the gate and drain of the transistor 22, and the drain thereof connected to the negative supply $V_{SS}$. In this configuration, the transistor 38 provides bias current for the diode-connected transistor 40 only when the P-channel bias voltage $V_{PB}$ applied to the gate of the transistor 38 is at least one $V_{GS}$ below the positive supply $V_{DD}$. By constructing the transistor 40 to have a smaller ratio of channel width to channel length than the transistor 38 and thus a higher current density, the gate to source voltage $V_{GS}$ of the transistor 40 will be relatively high when the transistor 38 is turned on. Thus, the transistor 42 will be turned on only when the transistor 38 is turned off, i.e. when the bias current reference circuit 10 is in the passive state. When the transistor 42 turns on, the voltage on the gate and drain of the transistor 22 of the reference voltage portion 12 is pulled toward the negative supply $V_{SS}$.

When the transistor 42 has pulled the voltage on the gate of the transistor 22 one $V_{GS}$ below the $V_{BE}$ of the transistor 20, start-up current begins to flow through the transistors 20 and 22. Simultaneously, the transistor 24 of the reference current portion 14 will turn on, allowing reference current to flow to the transistor 28 of the bias voltage portion 16. The transistor 28, being connected as a diode, establishes the N-channel bias voltage $V_{NB}$ one $V_{GS}$ above the negative supply $V_{SS}$. Simultaneously, the transistor 30 assumes the task of directing the flow of bias current through the reference voltage portion 12 by maintaining the transistors 20 and 22 in the forward-biased condition. The bias current reference circuit 10 will thereafter remain in the active state.

With the N-channel bias voltage $V_{NB}$ established, the transistor 32 provides a path for current to flow through the transistor 34. The transistor 34, being diode-connected, establishes the P-channel bias voltage $V_{PB}$ one $V_{GS}$ below the positive supply $V_{DD}$. Simultaneously, the transistor 38 turns the transistor 42 off by pulling the gate thereof toward the positive supply $V_{DD}$. Thus, the start-up portion 36 becomes inactive once the bias current reference circuit 10 assumes the active state. On the other hand, the start-up portion 36 automatically becomes active if, for any reason, the bias current reference circuit 10 should try to return to the inactive state.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A bias current reference circuit comprising:

reference voltage means for providing a reference voltage proportional to a bias current, comprising:

a first diode-connected device; and a second diode-connected device coupled in series with said first diode-connected device;

reference current means coupled to the reference voltage means, for providing a reference current proportional to the reference voltage;

bias voltage means coupled to the reference current means, for providing a bias voltage proportional to the reference current; and bias current means coupled to the bias voltage means and to the reference voltage means, for providing the bias current proportional to the bias voltage for said reference voltage means.

2. The bias current reference circuit of claim 1 wherein the first diode-connected device comprises a diode-connected bipolar transistor, and said second diode-connected device develops the reference voltage on the gate thereof.

3. The bias current reference circuit of claim 1 or 2 wherein the reference current means comprises a resistor connected in series with an MOS transistor having the reference voltage coupled to the gate thereof.

4. The bias current reference circuit of claim 1 or 2 wherein the bias voltage means comprises a diode-connected MOS transistor having the reference current coupled thereto, said transistor developing the bias voltage on the gate thereof.

5. The bias current reference circuit of claim 1 or 2 wherein the bias current means comprises an MOS transistor having the bias voltage coupled to the gate thereof, said transistor providing the bias current for the reference voltage means.

6. The bias current reference circuit of claim 1 or 2 further comprising:

second bias current means coupled to the bias voltage means, for providing a second bias current proportional to the bias voltage.

7. The bias current reference circuit of claim 6 wherein the second bias current means comprises an MOS transistor having the bias voltage coupled to the gate thereof, said transistor providing said second bias current.

8. The bias current reference circuit of claim 6 further comprising:

second bias voltage means coupled to the second bias current means, for providing a second bias voltage proportional to the second bias current.

9. The bias current reference circuit of claim 8 wherein the second bias voltage means comprises a diode-connected MOS transistor having the second bias current coupled thereto, said transistor developing the second bias voltage on the gate thereof.

10. The bias current reference circuit of claim 8 further comprising:

start-up means coupled to the reference voltage means and to the second bias voltage means, for providing the bias current for said reference voltage means in response to the second bias voltage being less than a predetermined threshold.

11. A bias current reference circuit comprising:

a bipolar transistor having the base and collector thereof coupled to a positive supply;

a first P-channel MOS transistor having the source thereof coupled to the emitter of the bipolar transistor;

a second P-channel MOS transistor having the gate thereof coupled to the gate of the first P-channel transistor;

a resistor coupled between the positive supply and the source of the second P-channel transistor;

a first N-channel MOS transistor having the source thereof coupled to a negative supply, and the gate and drain thereof coupled to the drain of the second P-channel transistor; and a second N-channel MOS transistor having the source thereof coupled to the negative supply, the gate thereof coupled to the gate and drain of the first N-channel transistor, and the drain thereof coupled to the gate and drain of the first P-channel transistor.

12. The bias current reference circuit of claim 11 further comprising:

a third N-channel MOS transistor having the source thereof coupled to the negative supply, and the gate thereof coupled to the gate and drain of the first N-channel transistor; and a third P-channel MOS transistor having the source thereof coupled to the positive supply, and the gate and drain thereof coupled to the drain of the third N-channel transistor.

13. The bias current reference circuit of claim 12 further comprising:

a fourth P-channel MOS transistor having the source thereof coupled to the positive supply, and the gate thereof coupled to the gate and drain of the third P-channel transistor;

a fifth P-channel MOS transistor having the source thereof coupled to the drain of the fourth P-channel transistor, and the gate and drain thereof coupled to the negative supply; and a sixth P-channel MOS transistor having the source thereof coupled to the gate and drain of the first P-channel transistor, the drain thereof coupled to the negative supply, and the gate thereof coupled to the drain of the fourth P-channel transistor.

* * * * *